(12) United States Patent
Gallardo (10) Patent No.: US 11,558,567 B2
(45) Date of Patent: Jan. 17, 2023

(54) OPTICAL ACTIVE PIXEL SENSOR USING TFT PIXEL CIRCUIT

(71) Applicant: Sharp Kabushiki Kaisha, Osaka (JP)

(72) Inventor: Diego Gallardo, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 274 days.

(21) Appl. No.: 16/821,120

(22) Filed: Mar. 17, 2020

(65) Prior Publication Data
US 2021/0297612 A1 Sep. 23, 2021

(51) Int. Cl.
*H04N 5/363* (2011.01)
*H01L 27/146* (2006.01)
(Continued)

(52) U.S. Cl.
CPC ....... *H04N 5/363* (2013.01); *H01L 27/14612* (2013.01); *H01L 27/14636* (2013.01); *H01L 27/14678* (2013.01); *H01L 29/24* (2013.01); *H01L 29/7869* (2013.01); *H01L 31/02005* (2013.01); *H04N 5/378* (2013.01); *G06V 40/172* (2022.01)

(58) Field of Classification Search
CPC ...... H04N 5/363; H04N 5/378; H04N 5/3575; H04N 5/374; H04N 5/369; H01L 27/14612; H01L 27/14636; H01L 27/14678; H01L 29/24; H01L 29/7869; H01L 31/02005; H01L 27/146; H01L 27/14601; H01L 27/14609; H01L 27/14643; G06V 40/172; G06V 40/1318
See application file for complete search history.

(56) References Cited

U.S. PATENT DOCUMENTS

2008/0259182 A1* 10/2008 Karim .................... H04N 5/335
348/E3.018
2010/0091162 A1* 4/2010 Chuang .................. H04N 5/374
348/308
(Continued)

OTHER PUBLICATIONS

Novel Integrated CMOS Sensor Circuits; IEEE Transactions on Nuclear Science, vol. 51 No. 5, Oct. 2004; Stuart Kleinfelder.
(Continued)

*Primary Examiner* — Albert H Cutler
(74) *Attorney, Agent, or Firm* — Renner, Otto, Boisselle & Sklar, LLP (57) ABSTRACT

A unit cell for use in an optical active pixel sensor (APS) includes a photodiode having a first terminal connected to a photodiode biasing PDB line, and a second terminal opposite from the first terminal; a reset switch transistor having a first terminal connected to the second terminal of the photodiode, and a second terminal connected to a reference voltage line, and a gate of the reset switch transistor is connected to a reset signal RST supply line; and an amplification transistor having a first terminal connected to an output readout line, and a second terminal connected to a driving voltage supply line, and a gate of the amplification transistor is connected to a node constituting the connection of the second terminal of the photodiode and the first terminal of the reset switch transistor. An optical APS device includes a sensor matrix formed of a plurality of unit cells according to any of the embodiments arranged in an array of rows and columns.

19 Claims, 8 Drawing Sheets

(51) Int. Cl.
*H01L 29/24* (2006.01)
*H01L 29/786* (2006.01)
*H01L 31/02* (2006.01)
*H04N 5/378* (2011.01)
*G06V 40/16* (2022.01)
*H04N 5/357* (2011.01)
*H04N 5/374* (2011.01)
*H04N 5/335* (2011.01)
*H04N 5/341* (2011.01)

(56) References Cited

U.S. PATENT DOCUMENTS

2016/0027827 A1* 1/2016 Sekine .................... H01L 29/24
257/43
2019/0362120 A1* 11/2019 Yeke Yazdandoost ......................
H01L 27/14678
2019/0393249 A1* 12/2019 Lilak .................. H01L 27/0886

OTHER PUBLICATIONS

Source Follower Noise Limitations in CMOS Active Pixel Sensors; Proceedings of SPIE—The International Society for Optical Engineering, Jan. 2003; K.M. Findlater.

* cited by examiner

OPTICAL ACTIVE PIXEL SENSOR USING TFT PIXEL CIRCUIT

TECHNICAL FIELD

The present application relates to optical active pixel sensors (APS), and more particularly to a unit cell pixel circuit and a related optical APS that includes an array of such unit cells.

BACKGROUND ART

Optical sensors are employed in a variety of applications by which a parameter, device characteristic, or state is determined based upon an amount of light detected by the sensor. Optical sensors have numerous applications, such as in imaging, x-ray detection (whereby x-rays are converted to visible light for detection), position detection, photo-electric detection, and others. One current usage in the field of displays and security is fingerprint sensing used for identification, such as for example to unlock a mobile telephone.

One type of optical sensor is a passive optical sensor, which simply incorporates a light sensor that converts light into an electronic output signal that is read directly by a suitable reading device. In many applications, however, enhanced performance is achieved by using an active sensor, which subjects the output signal from the light sensor to some type of signal treatment, typically signal amplification. For active sensing, an active pixel sensor (APS) may be employed. Optical APS devices are formed of an array or matrix of photo-sensing unit cell pixel circuits, whereby each unit cell pixel circuit includes an individual light sensor component, such as a light sensing photodiode, that is coupled to amplification circuit components. A driver integrated circuit (driver IC) provides input control signals and driving voltages for row selecting and sensing, and a data reader integrated circuit (data reader IC) reads out signals from the sensor matrix of unit cells. As referred to herein and known in the art, the data reader IC also may be referred to as an analogue front end (AFE).

In conventional configurations, APS devices have been made using CMOS silicon transistors in the unit cell pixel circuitry. CMOS transistors are small (potentially on the order of nanometers) and have high performance, but they are expensive to fabricate. CMOS transistors generally are grown on a semiconductor wafer and thus typically require a common semiconducting back substrate and/or common epitaxial well. Typical CMOS-based optical APS circuits employ three or more transistors. One of the most successful architectures employs a photodiode, four transistors, a capacitor and a potential well, to provide amplification and control reset noise (one of the most common noise sources in APS architectures). This high number of components is possible in CMOS technology mostly due to the small size of CMOS transistors.

An alternative transistor type known in the art is a thin film transistor (TFTs). Multiple TFTs readily may be fabricated on a glass or similar substrate, and thus it is inexpensive and easier to fabricate large TFT arrays on glass as compared to CMOS silicon technology. TFTs, therefore, have found application in technologies that employ pixel circuit arrays, including for example pixel circuit arrays in high-resolution LCD and emissive displays.

TFTs, however, have certain drawbacks that have hindered their use in APS devices. As compared to CMOS transistors, TFTs tend to have lower carrier mobility, and are larger in size (typically on the order of micrometers). Accordingly, conventional APS unit cell topographies would require large unit cells, with a deleterious impact on sensor density. Accordingly, the benefits of low cost and easy fabrication on glass associated with TFTs have not been realized in the field of APS devices.

SUMMARY OF INVENTION

The present application relates to an enhanced optical active pixel sensor (APS) that effectively employs thin film transistors (TFTs) within the unit cell pixel circuit. Embodiments of the present application include a unit cell pixel circuit topography that incorporates a two-transistor configuration to amplify an output sensing signal generated by a light sensing photodiode. No additional capacitor is required. By limiting the unit cell configuration to only two TFT transistors, while still achieving effective sensing, the benefits of low cost and easy fabrication on a glass or comparable substrate associated with TFTs are realized in the APS device.

In exemplary embodiments, an optical APS includes a matrix of interconnected unit cells, whereby each unit cell constitutes a pixel within the matrix. Generally, the unit cell pixel circuit includes a light sensor, control and signal lines, and circuitry to enhance the sensor output, including a two-transistor configuration for pixel selection and amplification of the output signal. A driver IC provides the unit cell matrix with appropriate control signals, generally along a first direction (e.g., by row of the matrix). An analogue front end (AFE) IC reads and processes the output signals of the unit cells, generally along a second direction (e.g., column of the matrix).

In exemplary embodiments, the two-transistor unit cell configuration includes a photodiode having a first terminal, e.g., anode, connected to a photodiode biasing line, and a second terminal, e.g., cathode, opposite from the first terminal. The unit cell further includes a first switch transistor, also referred to as a reset switch transistor, having a first terminal connected to the second terminal (cathode) of the photodiode, and a second terminal connected to a reference voltage line, typically ground. A gate of the reset switch transistor is connected to a reset signal supply line, RST. The unit cell further includes a second transistor, also referred to as an amplification transistor, having a first terminal connected to an output line to the AFE, and a second terminal connected to a driving voltage supply line. A gate of the amplification transistor is connected to a node constituting the connection of the second terminal (cathode) of the photodiode and the first terminal of the reset switch transistor.

The unit cell operates as follows. When the RST line is a high voltage, the reset transistor is in an on state, and the photodiode cathode is electrically connected to the reference voltage (ground). When the RST line has a low voltage, the reset transistor is in an off state, and the photodiode cathode is disconnected from ground. The amplification transistor is configured as a source follower with its gate connected to the photodiode cathode, its drain connected to the driving voltage supply line, and its source directly connected to the output line. Generally, the unit cell has three operational stages: reset, photo-sensing, and readout, although there also can be some dead time between stages or between cycles of the three stages in which the unit cell is not performing.

During the reset stage, the driver IC sets the RST line HI, and the reset transistor M1 is switched on, thereby electrically connecting the photodiode cathode to the reference voltage (ground). The photodiode anode is connected to the photodiode biasing line (PDB), which is LO. The LO potential is negative with respect to the reference voltage, so the photodiode is reverse biased. During the reset stage, the photodiode's internal capacitance charges up. The duration of the RST pulse, to, preferably is long enough for a complete charging of the photodiode capacitance, such that right after RST's falling edge at the end of the reset stage, the photodiode capacitance has been fully charged. The photodiode anode is connected to the LO photodiode basing line, whereas the photodiode cathode is connected to the gate of the amplification transistor. In this manner, the photodiode is isolated from the reference voltage.

During the photo-sensing stage, light is absorbed by the photodiode, and the photodiode capacitance discharges in an amount proportional to the illuminance of the incident light received. As the photodiode discharges, the gate potential $V_{GATE}$ at the gate of the amplification transistor falls towards the anode potential, which is at LO corresponding to the voltage at the photodiode biasing line. The final $V_{GATE}$ potential depends on the amount of light incident on the photodiode during the sensing stage. The higher the illuminance, the closer $V_{GATE}$ will be pulled down toward the LO voltage at the photodiode biasing line.

During the readout stage, the photodiode biasing voltage is set to HI. As the reset transistor is off, and no current flows through the amplification transistor gate, the potential $V_{GATE}$ moves up by (PDB/HI−PDB/LO). PDB HI is adjusted so that $V_{GATE}$ at readout is larger than $V_{th}$ of the amplification transistor. Therefore, the amplification transistor is sourcing current towards the AFE. The amount of such current is a function of $(V_{GATE}-V_{th})$, which in turn is proportional to the illuminance of the incident light received by the photodiode during the photo-sensing stage. The AFE IC reads the output signal from the amplification transistor during the readout stage, and the AFE converts the output signal to a digital signal. At the end of the readout stage, $V_{GATE}$ drops again below $V_{th}$, and thus the amplification transistor shuts off. The readout operation is non-destructive, i.e. the photodiode charge is not affected by the readout operation.

In exemplary embodiments, the unit cell further may operate to perform an additional reset noise cancellation operation. As is known in the art, one significant issue associated with APS unit cells is that noise is introduced during the reset stage when the unit cell is reset to an initial reference state. An advantage of the non-destructive readout capability of the two-transistor TFT unit cell configuration is the capability of compensating for reset noise. During the reset stage, the reset transistor behaves like a resistor, and thermal noise of the reset transistor gets stored as a random value in the photodiode capacitance. This noise can be cancelled by correlated double sampling, which is permitted because of the non-destructiveness of the readout operation as to the photodiode capacitance. First, the photodiode is reset as described above as to the reset stage. Subsequent to the reset stage and prior to the photo-sensing stage, the photodiode is read out a first time, and the photodiode output $V_1=(V_{signal1}+V_{noise})$, which contains the reset noise signal, is stored in an external memory. The unit cell then proceeds to operate in the photo-sensing and readout stages, and during the readout stage the photodiode is read out a second time having a photodiode output $V_2=(V_{signal2}+V_{noise})$. Because $V_1$ and $V_2$ are read out under the same input conditions, both $V_1$ and $V_2$ share an identical reset noise value $V_{noise}$. Therefore, electronically subtracting $(V_2-V_1)$ results in a readout value that is not affected by the reset noise, which in turn results in improved signal-to-noise ratio (SNR).

Another aspect of the invention is an optical APS device including a sensor matrix formed of a plurality of unit cells according to any of the embodiments arranged in an array of rows and columns. The APS device further may include a driver IC connected to the sensor matrix that supplies the reset signal to the reset transistors of the sensor matrix, and that supplies a photodiode biasing signal to the photodiodes of the sensor matrix. The APS device further may include an analogue front end (AFE) connected to the sensor matrix that reads and processes output readout signals that are outputted from the output readout lines of the sensor matrix.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF EMBODIMENTS

Embodiments of the present application will now be described with reference to the drawings, wherein like reference numerals are used to refer to like elements throughout. It will be understood that the figures are not necessarily to scale.

The present application relates to an enhanced optical active pixel sensor (APS) that effectively employs thin film transistors (TFTs) within the unit cell pixel circuit. Embodiments of the present application include a unit cell pixel circuit topography that incorporates a two-transistor TFT configuration to amplify an output sensing signal generated by a light sensing photodiode. By limiting the unit cell configuration to only two TFT transistors, while still achieving effective sensing, the benefits of low cost and easy fabrication on a glass or comparable substrate associated with TFTs are realized in the APS device.

Figure 1:
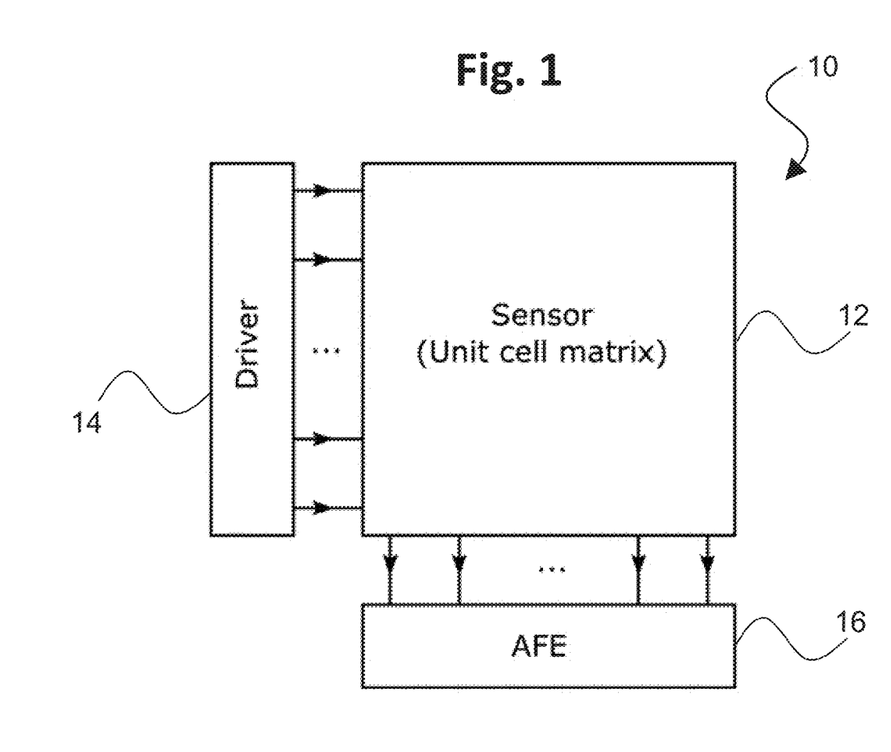
FIG. 1 is a drawing depicting a block diagram of operative portions of an optical APS device.

FIG. 1 is a drawing depicting a block diagram of operative portions of an exemplary optical APS device 10. Generally, optical APS 10 includes a sensor formed of a matrix of interconnected unit cells 12, whereby each unit cell constitutes a pixel within the matrix. The unit cell matrix 12 may be configured as a two-dimensional array of unit cells arranged in K rows by N columns, with K and N being positive integers of at least one. Any suitable number of rows and columns may be employed as is suitable for any particular application. As further detailed below, each unit cell pixel circuit includes a light sensor, control and signal lines, and circuitry to enhance the sensor output, including a two-transistor configuration for pixel selection and amplification of the output signal. In exemplary embodiments as further detailed below, the two transistors are TFT transistors. The APS 10 further includes a driver IC 14 that provides the unit cell matrix 12 with appropriate control signals, generally along a first direction, for example by row of the matrix as illustrated in FIG. 1. The APS 10 further includes an analogue front end (AFE) IC 16 that reads and processes the readout output signals of the unit cells, generally along a second direction, for example by column of the matrix as illustrated in FIG. 1.

Figure 2:
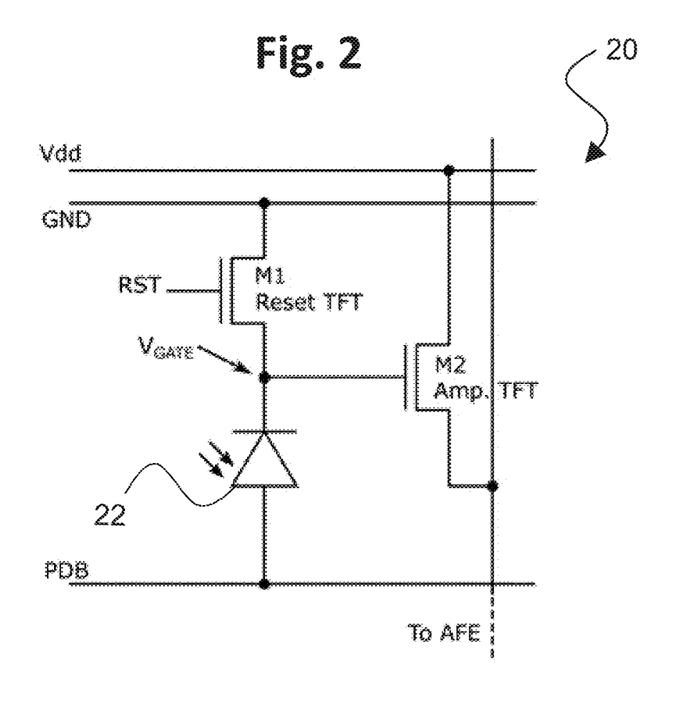
FIG. 2 is a drawing depicting an exemplary unit cell pixel circuit configuration for use in an optical APS device, in accordance with embodiments of the present application.

FIG. 2 is a drawing depicting an exemplary unit cell pixel circuit configuration 20 for use in an optical APS device, in accordance with embodiments of the present application. The unit cell 20 employs a two-transistor configuration as referenced above. In exemplary embodiments, unit cell 20 includes a photodiode 22 having a first terminal, e.g., anode, connected to a photodiode biasing line PDB, and a second terminal, e.g., cathode, opposite from the first terminal. The unit cell further includes a first switch transistor M1, also referred to as a reset switch transistor, having a first terminal connected to the second terminal (cathode) of the photodiode 22, and a second terminal connected to a reference voltage line, which may be ground GND as a suitable reference voltage level. A gate of the reset switch transistor M1 is connected to a reset signal supply line RST. The unit cell further includes a second transistor M2, also referred to as an amplification transistor, having a first terminal connected to an output readout line to the AFE, and a second terminal connected to a driving voltage supply line Vdd. A gate of the amplification transistor M2 is connected to a node constituting the connection of the second terminal (cathode) of the photodiode and the first terminal of the reset switch transistor M1. A voltage at the gate of amplification transistor M2 at such node is denoted $V_{GATE}$ in FIG. 2.

In a preferred embodiment, to reduce cost and enhance ease of fabrication of the APS, the transistors M1 and M2 are thin film transistors (TFTs). The TFTs M1 and M2 may be fabricated using TFT fabrication processes conventional in the art. As part of such processes, the unit cell 20 may be disposed on a substrate, such as a glass substrate, which is a suitable substrate material for APS devices. Plastic and metal substrates as are used in the art of TFT fabrication also may be employed. Such substrates differ from substrates used in CMOS devices in that the TFT substrate materials are not mono-crystalline, in contrast to silicon used in CMOS devices which renders CMOS devices more expensive to fabricate.

The TFTs may be metal oxide transistors, such as for example indium gallium zinc oxide (IGZO) transistors. Such transistors generally are n-type transistors, whereby a high voltage with respect to the source is applied to the transistor gate to place the transistor in an on state, and a low voltage with respect to the source is applied to the transistor gate to place the transistor in an off state.

The unit cell operates as follows. Generally, when the reset RST line is a high voltage, the reset transistor M1 is in an on state, and the photodiode cathode is electrically connected to ground GND (or other suitable reference voltage). When the reset RST line has a low voltage, the reset transistor M1 is in an off state, and the photodiode cathode is electrically disconnected from ground GND. The amplification transistor M2 is configured as a source follower with its gate connected to the photodiode cathode, its drain connected to the driving voltage supply line Vdd, and its source directly connected to the output line that ultimately supplies the output signal of the unit cell 20 to the AFE.

Figure 3:
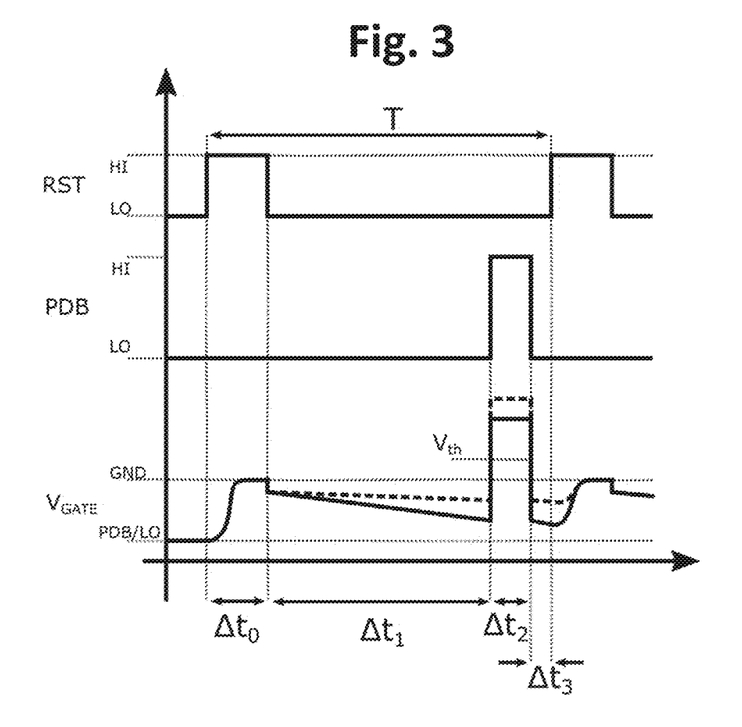
FIG. 3 is a drawing depicting a timing diagram associated with the operation of the unit cell of FIG. 2.

FIG. 3 is a drawing depicting a timing diagram associated with the operation of the unit cell of FIG. 2. Generally, the unit cell has three operational stages: reset, photo-sensing, and readout stages, although there also can be some dead time between stages, and/or an inter-cycle delay between cycles of the three operational stages, in which the unit cell is not performing. In the timing diagram of FIG. 3, the horizontal axis represents time T, and the vertical axis indicates relative voltage levels of the reset signal RST, the photodiode biasing voltage PDB, and the gate voltage $V_{GATE}$ of the amplification transistor M2, with respect to the unit cell as further detailed below.

Referring to the timing diagram of FIG. 3 in connection with the unit cell circuit topography depicted in FIG. 2, at the beginning of the reset stage, denoted as to in FIG. 3, the driver IC sets the RST line HI, which switches the reset transistor M1 to the on state. With M1 on, the photodiode cathode becomes electrically connected to the reference voltage, which may be ground GND as indicated in the figure, which commensurately sets the gate voltage $V_{GATE}$ at the gate of the amplification transistor M2 to ground.

The photodiode anode is connected to the photodiode biasing line PDB, which is LO during the reset stage. The PDB LO potential is negative with respect to the reference voltage (e.g., ground GND), so the photodiode 22 is reverse biased. The exact voltage value of PDB LO can be adjusted for best performance to provide an adequate reverse bias without damaging the photodiode, and for typical photodiodes a suitable PDB LO potential is about −10 V when the reference voltage is ground. The reverse bias configuration causes the photodiode to behave like a capacitor, and during the reset stage the photodiode's internal capacitance charges up. The duration of the RST pulse, $\Delta t_0$, preferably is long enough for a complete charging of the photodiode capacitance. At the end of the reset stage, RST is switched LO to turn off the reset transistor. Accordingly, at RST's falling edge at the end of the reset stage, the photodiode capacitance essentially has been fully charged. Because the photodiode anode is connected to the LO photodiode basing line, and the photodiode cathode is connected to the gate of the amplification transistor M2, when RST is switched low at the end of the reset stage the photodiode 22 becomes isolated from ground GND as the reset transistor M1 turns off.

The unit cell 20 next is operable in a photo-sensing stage, denoted as $\Delta t_1$ in FIG. 3. During the photo-sensing stage, $\Delta t_1$, incident light is absorbed by the photodiode 22, and the photodiode capacitance internally discharges in an amount proportional to the illuminance of the incident light received by the photodiode 22. As light is absorbed by the photodiode 22, electron/hole pairs are created, with the level of electron/hole pair creation being proportional to the illuminance or intensity of the incident light. Internal capacitance discharge within the photodiode occurs by electrons migrating to the positive cathode, and holes migrating to the negative anode, where the electrons and holes respectively are neutralized thereby discharging the internal capacitance of the photodiode. In turn, therefore, the degree of capacitance discharge likewise is proportional to the illuminance of the incident light received by the photodiode 22.

As the photodiode 22 discharges, the gate potential $V_{GATE}$ at the gate of the amplification transistor M2 is pulled towards the anode potential dictated by the photodiode biasing line, which remains at PDB LO during the photo-sensing stage. In FIG. 3, the solid and dashed lines represent responses of the unit cell as to two different relative illuminances of incident light. The final $V_{GATE}$ potential at the end of the photo-sensing stage depends on the amount or illuminance (intensity) of light incident on the photodiode 22 during the sensing stage. Generally, the gate voltage of the amplification transistor is pulled toward PDB in an amount proportional to the illuminance of the incident light. For example, for a relatively higher illuminance of incident light, $V_{GATE}$ is pulled down more toward the LO voltage at the photodiode biasing line, which is represented by the solid line in FIG. 3, as more electrons and holes are neutralized for greater discharge of the internal photodiode capacitance charge. Conversely, for a relatively lower illuminance of incident light, $V_{GATE}$ is pulled down less toward the LO voltage at the photodiode biasing line, which is represented by the dashed line in FIG. 3, as fewer electrons and holes are neutralized for less discharge of the internal photodiode capacitance charge. $V_{GATE}$ is negative at all times during the photo-sensing stage $\Delta t_1$ as illustrated in FIG. 3. The amplification transistor M2, therefore, may be configured such that the threshold voltage of the amplification transistor M2 is greater than zero, i.e. M2 $V_{th} \geq 0$, and $V_{GATE} < V_{th}$ during the photo-sensing stage, and thus the amplification transistor M2 is in an off state during the photo-sensing stage $\Delta t_1$.

If $V_{GATE}$ of M2 reaches PDB LO before the end of $\Delta t_1$, the unit cell will be "saturated", and it would not be possible to quantify any additional amount of light incident on the photodiode 22. This situation can be avoided by selectively setting the voltage level of PDB LO, and the duration of the photo-sensing stage $\Delta t_1$, in combination to avoid saturation of the photodiode. In an example of PDB LO of about −10 V as referenced above, a suitable duration of $\Delta t_1$ can be as long as several tens or hundreds of milliseconds for fingerprint sensing as an example usage. Generally, for high illuminance applications, $\Delta t_1$ may be shortened to prevent saturation while still achieving full photodiode capacitance charging, and for lower illumination applications, $\Delta t_1$ may be lengthened as full photodiode capacitance charging can be achieved without saturation.

The unit cell 20 next is operable in a readout stage, denoted as $\Delta t_2$ in FIG. 3. During the readout stage, $\Delta t_2$, the photodiode biasing voltage is set to PDB HI. Generally, the level of PDB HI is to be sufficient to raise the voltage $V_{GATE}$ at the gate of the amplification transistor M2 to exceed the threshold voltage $V_{th}$ of the amplification transistor M2, so as to be sufficient to turn on amplification transistor M2 to the on state during the readout stage. In the example given above in which PDB LO is set at −10 V, a suitable level of PDB HI is +2-3 V.

As the reset transistor M1 remains off during the readout stage, and thus no current flows to the gate of the amplification transistor M2, the potential $V_{GATE}$ at the gate of the amplification transistor M2 moves up by (PDB/HI−PDB/LO). As referenced above, PDB HI is set so that $V_{GATE}$ during the readout stage is greater than $V_{th}$ of the amplification transistor M2. Therefore, the amplification transistor M2 is placed in the on state during the readout stage and is sourcing current down the output line towards the AFE IC. Current is supplied from a driving voltage supply line Vdd, and the amount of such current through M2 is a function of $(V_{GATE}-V_{th})$, which in turn is proportional to the illuminance of the incident light received by the photodiode during the photo-sensing stage. The AFE IC reads the output signal from the amplification transistor M2 during the readout stage, and the AFE converts the output signal to a digital signal which in turn is proportion to the illuminance of light as follows from the gate voltage of the amplification transistor. According, based on the output readout signal, the illuminance of the incident light can be determined. At the end of the readout stage, the voltage at the photodiode biasing line is switched back to PDB LO, and thus $V_{GATE}$ drops again below $V_{th}$ which turns off the amplification transistor M2. The readout operation is non-destructive in the sense that the photodiode charge is not affected by the readout operation.

As illustrated in FIG. 3, a certain period of an inter-cycle delay time $\Delta t_3$ in which the unit cell is not operating may lapse before the sensing cycle repeats, i.e., between an end of the readout stage of a given cycle and a reset stage of the next cycle. Such an inter-cycle delay is particularly suitable when the readout operation is performed row-wise. Other dead-time periods in which the unit cell is not operating may be inserted within the cycle between stages as warranted for synchronisation with external systems, including synchronization with the driver IC and/or the AFE IC.

The two-TFT configuration described above has advantages over conventional CMOS configurations. The two-TFT design benefits from independent access to both terminals of the photodiode. In general, this is not possible or practical in CMOS configurations due to the shared bulk semiconductor region or the common epitaxial layer.

The sensitivity of the unit cell can be increased (or decreased) by increasing (or decreasing) the photo-sensing interval $\Delta t_1$. In addition, PDB HI sets the maximum value of $V_{GATE}$. Low (or high) values of PDB HI increase sensitivity at low (or high) illumination. However, PDB HI values have to be compatible with the amplifier TFT operation region, or the TFT could be saturated (too high PDB HI) or prematurely switched off (too low PDB HI).

Figure 4:
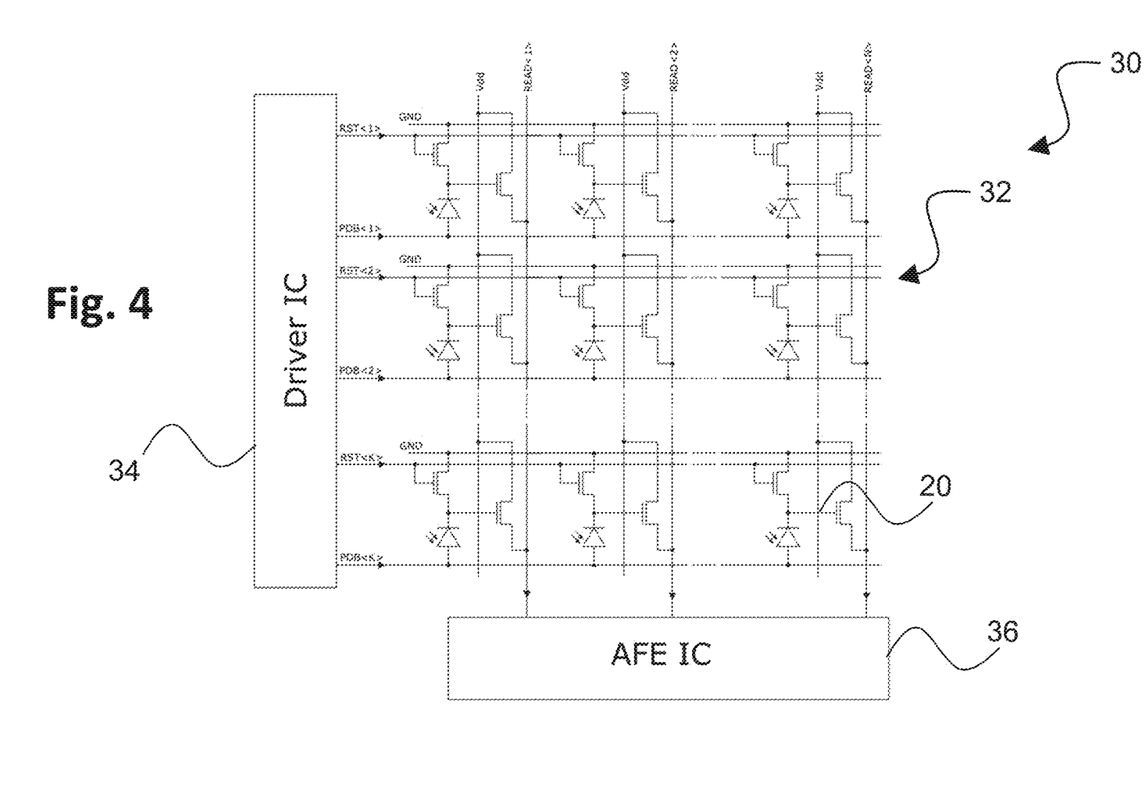
FIG. 4 is a drawing depicting an optical APS device in accordance with embodiments of the present application, including an array of unit cells of FIG. 2

FIG. 4 is a drawing depicting an optical APS device 30 in accordance with embodiments of the present application, including an array of individual unit cells 20 accordingly to any of the embodiments as illustrated representatively in FIG. 2. Accordingly, each unit cell 20 incudes a two-transistor configuration as described above in connection with FIG. 2, with the transistors preferably being TFT transistors.

The array of individual unit cells 20 constitutes a sensor matrix 32 similar to the matrix 12 identified above in connection with FIG. 1. The sensor matrix of unit cells 32 is configured as a two-dimensional array of unit cells arranged in K rows by N columns, with K and N being positive integers of at least one. FIG. 4 illustrates a K×N sensor unit cell matrix, and any suitable number of rows and columns may be employed as is suitable for any particular application. The APS device 30 further includes a driver IC 34 that provides the unit cell matrix 32 with appropriate control signals, including the reset RST signal to the reset transistors and the photodiode biasing PDB signal to the photodiodes of the unit cells of the sensor matrix. Such signals generally are inputted along a first direction, for example by Row(K) of the unit cell matrix 32 as illustrated in FIG. 4. The APS device 30 further includes an analogue front end (AFE) IC 36 that reads and processes the output readout signals of the unit cells from the Read lines generally along a second direction, for example by Column(N) of the matrix 32 as illustrated in FIG. 4. In the example of FIG. 4, the reference voltage supply lines (e.g., ground GND supply lines) are oriented in a first direction, such as horizontally, and the driving voltage supply lines Vdd are oriented in a second direction perpendicular to the first direction, such as vertically, but any suitable configuration of such lines may be employed. GND horizontal lines with Vdd vertical lines provides efficient balancing of the number of horizontal and vertical lines in the device.

Figure 5:
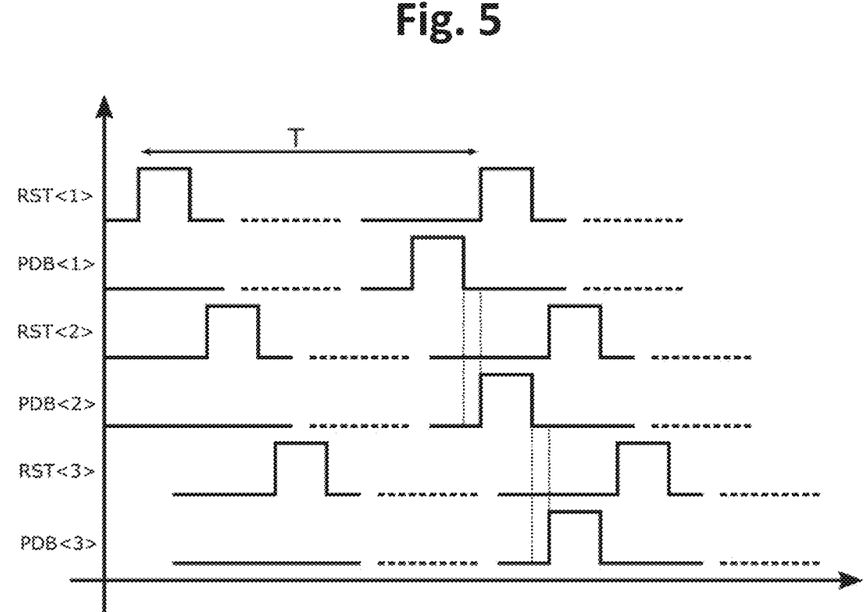
FIG. 5 is a drawing depicting a timing diagram associated with the operation of the APS device of FIG. 4.

FIG. 5 is a drawing depicting a timing diagram associated with the operation of the APS device of FIG. 4. Similarly as in the timing diagram of FIG. 3, in FIG. 5 the horizontal axis represents time T, and the vertical axis indicates relative voltage levels of the input control signals RST and PDB applied to the APS device. In this example, the reset RST signals and the photodiode biasing PDB signals are applied one row at a time in the manner described above in connection with FIG. 3 for each unit cell. The RST and PDB signals may be applied in a scanning operation by which the RST signal of a given row is pulsed in proximity to the falling edge of the RST pulse of the previous row. The vertical dashed lines of FIG. 5 denote zones of separation of time-adjacent PDB signals of different rows. The READ lines are shared by the unit cells of each column, and, therefore, it is desirable that there is no overlap of time-adjacent PDB HI pulses of different rows, as indicated by the dashed vertical lines in FIG. 5. Overlaps of RST signals of different rows, in contrast, have no effect on the output signals, and therefore such overlap is permissible if warranted for a particular implementation.

Figure 6:
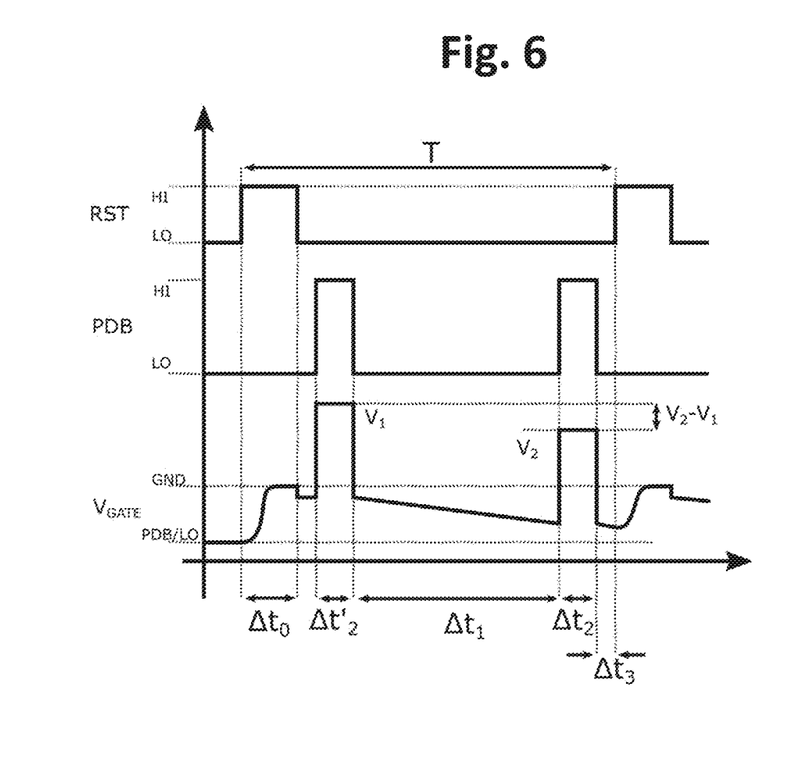
FIG. 6 is a drawing depicting an alternative timing diagram associated with the operation of the unit cell of FIG. 2, further illustrating a reset noise cancellation operation.

FIG. 6 is a drawing depicting an alternative timing diagram associated with the operation of the unit cell of FIG. 2, which is a variation on the timing diagram of FIG. 3 that further includes an additional reset noise cancellation operation. As is known in the art, one significant issue associated with APS unit cells is that noise is introduced during the reset stage when the unit cell is reset to the initial reference state. An advantage of the non-destructive readout capability of the two-transistor unit cell configuration, by which a readout operation does not affect the charge of the photodiode, is the capability of compensating for reset noise by performing the reset noise cancellation operation. During the reset stage, the reset transistor M1 behaves like a resistor, and thermal noise of the reset transistor gets stored as a random value in the photodiode capacitance. This noise can be cancelled by correlated double sampling by which the unit cell is read out twice, both once before and once after the photo-sensing stage, which is permitted because of the non-destructiveness of the readout operation as to the photodiode capacitance.

Referring to the timing diagram of FIG. 6 in connection with the circuit diagram of FIG. 2, the photodiode is reset as described above in connection with the timing diagram of FIG. 3 as to the reset stage. The reset stage again is denoted as $\Delta t_0$ in FIG. 6. Subsequent to the reset stage and prior to the photo-sensing stage, a first readout stage is performed to read out the photodiode a first time, denoted in FIG. 6 as $\Delta t'_2$. During such time, a first photodiode output $V_1=(V_{signal1}+V_{noise})$ is measured, which contains the reset noise signal, and the first photodiode output is stored in an external memory. The unit cell then proceeds to operate in the photo-sensing and readout stages comparably as described above with respect to the timing diagram of FIG. 3, denoted again in FIG. 6 respectively as $\Delta t_2$ and $\Delta t_2$. The readout stage $\Delta t_2$, therefore, constitutes a second readout stage, and thus the photodiode is read out a second time to measure a second photodiode output $V_2=(V_{signal2}+V_{noise})$. Because $V_1$ and $V_2$ are read out under the same input conditions, and the readout operation does not affect the photodiode charge (i.e., the readout operation is non-destructive), both $V_1$ and $V_2$ share an identical reset noise value. Therefore, electronically subtracting ($V_2-V_1$) results in an output readout signal value that is not affected by the reset noise, which in turn results in improved signal-to-noise ratio (SNR).

The reset noise cancellation operation is effectively performed without having a negative effect on the sensing performance. The timing diagrams of FIGS. 3 and 6 generally are not to scale for illustrative purposes. The readout stages $\Delta t'_2$ and $\Delta t_2$ can be as short as a few milliseconds. As referenced above, a suitable example duration of the photo-sensing stage $\Delta t_2$ can be on the order of a few tens or hundreds of milliseconds. Accordingly, the PDB pulse duration is negligible relative to the photo-sensing duration. As a result, there essentially is no $V_{GATE}$ change at the gate of the amplification transistor M2 as a result of the double sample readout stages to perform the reset noise cancellation operation.

Figure 7A:
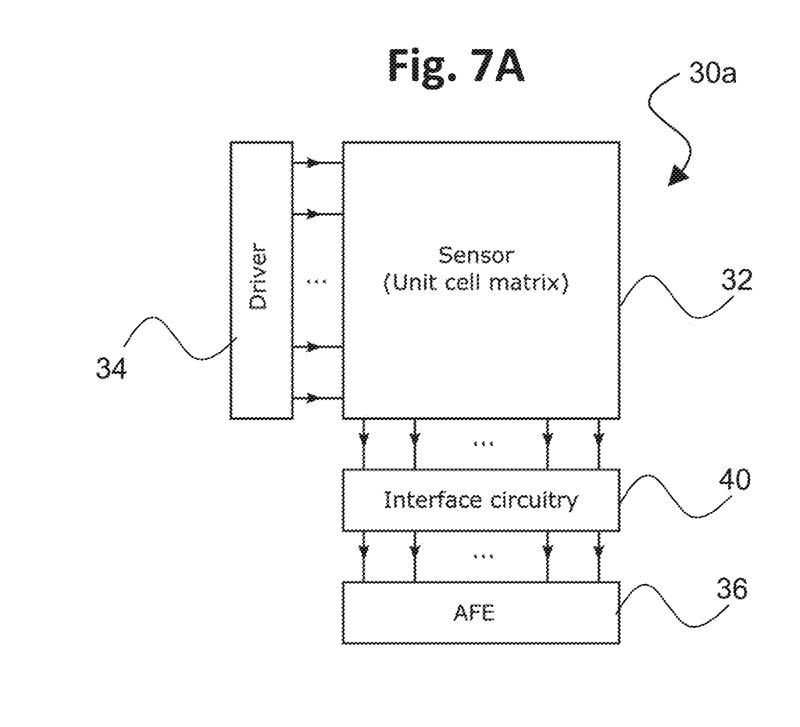
FIG. 7A is a drawing depicting variation of an optical APS device which employs interface circuitry between the unit cell matrix and the AFE.
Figure 7B:
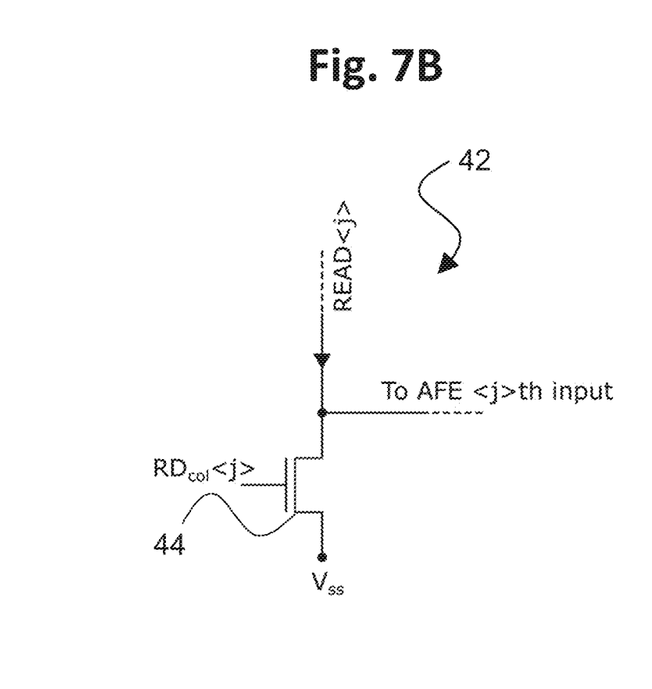
FIG. 7B is a drawing depicting an implementation of the interface circuitry for a unit cell.

FIG. 7A is a variation of an optical APS device 30*a* which employs sensor interface circuitry 40 between the unit cell matrix 32 and the AFE 36, and FIG. 7B is a drawing depicting an implementation of interface circuitry 42 for a unit cell that is incorporated into the sensor interface circuitry 40. Sensor interface circuitry 40 may be employed to apply a requisite signal conditioning to adapt the sensor output to particular specifications of the AFE. The interface circuitry may be implemented on a same substrate as the sensor matrix of unit cells. In the example of FIG. 7B, the unit cell interface circuitry 42 converts the output current from the amplification transistor M2 into a voltage, which can be fed to an AFE that requires a voltage input instead of a current input. In this example, the unit cell interface circuitry 42 includes a conversion element 44, which in this example is configured as a transistor. In a transistor implementation, a readout control signal $RD_{col}$ is applied on a column basis to the gate of the conversion element 44, which is biased by an input biasing voltage $V_{ss}$. This resistance of the conversion element operates to convert the READ current output signal from M2 into a voltage signal applied to the AFE. Although in this example the conversion element 44 is configured as a transistor, the conversion element alternatively may be implemented as a resistor to provide the conversion resistance.

The use of a unit cell pixel circuit topography that incorporates a two-transistor TFT configuration to amplify the output sensing signal generated using the light sensing photodiode has advantages over conventional configurations. By limiting the unit cell configuration to only two TFT transistors, while still achieving effective sensing, the benefits of low cost and easy fabrication on a glass or comparable substrate associated with TFTs are realized in the APS device. In addition, the non-destructiveness of the readout operation in not affecting the photodiode charge permits an enhanced reset noise cancellation operation for better overall sensor performance.

Figure 8:
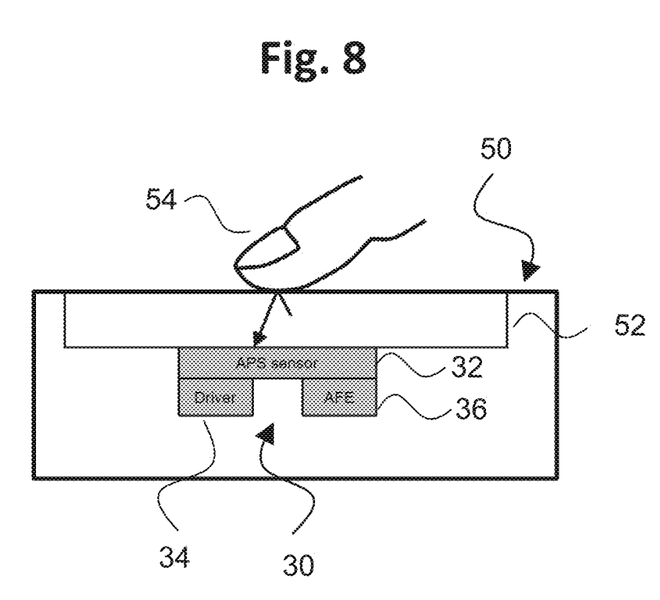
FIG. 8 is a drawing depicting an operative portion of an exemplary display system that includes an optical APS device in accordance with embodiments of the present application.

To illustrate a non-limiting example usage of the optical APS, FIG. 8 is a drawing depicting an operative portion of an exemplary display system 50 that includes an optical APS device 30 in accordance with embodiments of the present application. It will be appreciated that the optical APS device 30*a* of FIG. 7A also may be incorporated as the APS device incorporated into the display system 50. The optical APS device 30 may be incorporated into the display system 50 joined to the bottom of a display panel 52. The display panel 52 emits light, which is reflected by a finger 54 touching the display system 50. Different fingerprint features will reflect in different ways. The reflected light will travel through the display panel 52, parts of which will be transparent to the reflected light, to allow the reflections to reach the optical APS sensor 32. In one example usage, the APS device 30 may be used as a security feature of the display system to perform optical fingerprint sensing used for identification, such as for example to unlock a mobile telephone.

An aspect of the invention, therefore, is an enhanced sensor unit cell for use in an optical active pixel sensor (APS), that employs TFTs in the unit cell circuitry to reduce cost and complexity of the unit cell. In exemplary embodiments, the unit cell includes a photodiode having a first terminal connected to a photodiode biasing PDB line, and a second terminal opposite from the first terminal; a reset switch transistor having a first terminal connected to the second terminal of the photodiode, and a second terminal connected to a reference voltage line, and a gate of the reset switch transistor is connected to a reset signal RST supply line; and an amplification transistor having a first terminal connected to an output readout line, and a second terminal connected to a driving voltage supply line, and a gate of the amplification transistor is connected to a node constituting the connection of the second terminal of the photodiode and the first terminal of the reset switch transistor. The unit cell may include one or more of the following features, either individually or in combination.

In an exemplary embodiment of the unit cell, the reset switch transistor and the amplification transistor are thin film transistors.

In an exemplary embodiment of the unit cell, the reset switch transistor and the amplification transistor are n-type indium gallium zinc oxide (IGZO) transistors.

In an exemplary embodiment of the unit cell, the first terminal of the photodiode is an anode and the second terminal of the photodiode is a cathode.

Another aspect of the invention is an optical active pixel sensor (APS) that includes a sensor matrix having a plurality of unit cells according to any of the embodiments and arranged in an array of rows and columns. The optical APS may include one or more the following features, either individually or in combination.

In an exemplary embodiment of the optical APS, the optical APS further includes a driver IC connected to the sensor matrix that supplies the reset signal RST to reset switch transistors of the sensor matrix, and that supplies a photodiode biasing PDB signal to photodiodes of the sensor matrix; and an analogue front end (AFE) connected to the sensor matrix that reads and processes output readout signals that are outputted from output readout lines of the sensor matrix.

In an exemplary embodiment of the optical APS, the driver IC is configured to provide the RST and PDB signals on a row basis of unit cells of the sensor matrix, and the AFE is configured to read the output readout signals on a column basis of unit cells of the sensor matrix.

In an exemplary embodiment of the optical APS, the optical APS further includes interface circuitry connected between the sensor matrix and the AFE, wherein the interface circuitry is configured to apply signal conditioning to adapt the output readout signals to a specification of the AFE.

In an exemplary embodiment of the optical APS, the interface circuitry is implemented on a same substrate as the sensor matrix.

In an exemplary embodiment of the optical APS, the optical APS further includes reference voltage supply lines that supply a reference voltage to the sensor matrix, and driving voltage supply lines that supply a driving voltage to the sensor matrix to generate the output readout signals.

In an exemplary embodiment of the optical APS, the reference voltage supply lines are arranged in a first direction, and the driving voltage supply lines are arranged in a second direction perpendicular to the first direction.

Another aspect of the invention is a display system including a display panel, and an optical APS of any of the embodiments located adjacent to the display panel, wherein the optical APS senses light that is incident to the display system.

Another aspect of the invention is a method of operating an optical active pixel sensor (APS). In exemplary embodiments, the method includes steps of arranging a plurality of unit cell pixel circuits in a sensor matrix of rows and columns, wherein each unit cell of the plurality of unit cells is operable in a reset stage, a photo-sensing stage, and a readout stage. The reset stage includes: applying a reset signal RST to turn on a reset transistor of the unit cell to electrically connect a first terminal of a photodiode of the unit cell to a reference voltage; applying a photodiode biasing signal PDB to a second terminal of the photodiode, wherein PDB is set relative to the reference voltage to reverse bias the photodiode and to charge a capacitance of the photodiode; and at the end of the reset stage, switching RST to turn off the reset transistor to electrically isolate the photodiode from the reference voltage. The photo-sensing stage includes: absorbing incident light with the photodiode, wherein the photodiode capacitance discharges proportionally to an illuminance of the incident light; and wherein discharging the photodiode capacitance pulls a gate voltage of an amplification transistor connected to the second terminal of the photodiode toward PDB in an amount proportional to the illuminance of the incident light. The readout stage includes pulsing PDB to a level to raise the gate voltage of the amplification transistor sufficiently to turn on the amplification transistor; and reading out an output readout signal from the amplification transistor, wherein the output readout signal is dependent upon the gate voltage of the amplification transistor; and the illuminance of the incident light is determinable based on the output readout signal. The method of operating an optical APS may include one or more of the following features, either individually or in combination.

In an exemplary embodiment of the method of operating an optical APS, each unit cell of the plurality of unit cells further is operable to perform a reset noise cancellation operation to cancel reset noise that is introduced during the reset stage. The reset noise cancellation operation includes after the reset stage and before the photo-sensing stage, performing a first readout stage comprising pulsing PDB to the level to raise the gate voltage of the amplification transistor sufficiently to turn on the amplification transistor, and reading out an output readout signal from the amplification transistor and measuring a first photodiode output $V_1$; after the photo-sensing stage, performing a second readout stage comprising the readout stage as recited in claim 13 and measuring a second photodiode output $V_2$; and electronically subtracting $(V_2-V_1)$ to generate an output readout signal that is not affected by the reset noise.

In an exemplary embodiment of the method of operating an optical APS, the method further includes setting a level of PDB during the reset and photo-sensing stages, and a duration of the photo-sensing stage, in combination to avoid saturation of the photodiode during the photo-sensing stage.

In an exemplary embodiment of the method of operating an optical APS, the readout stage does not affect the charge of the photodiode.

In an exemplary embodiment of the method of operating an optical APS, RST and PDB are applied to the sensor matrix on a row basis, and the output readout signals are read on a column basis.

In an exemplary embodiment of the method of operating an optical APS, the method further includes an inter-cycle delay in which the unit cell is not operating between an end of the readout stage of a given cycle and a reset stage of a next cycle.

In an exemplary embodiment of the method of operating an optical APS, the readout output signal is an output current, and the method further comprises converting the output current to an output voltage for determining the illuminance of the incident light.

In an exemplary embodiment of the method of operating an optical APS, there is no overlap of time-adjacent PDB pulses of different rows.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to optical APS devices. Such devices have beneficial usage in a variety of light sensing applications, including for example imaging, x-ray detection (whereby x-rays are converted to visible light for detection), position detection, photo-electric detection, and fingerprint sensing.

REFERENCE SIGNS LIST

10—optical APS device
12—sensor matrix of unit cells
14—driver IC
16—AFE IC
20—unit cell pixel circuit
22—photodiode
30/30a—optical APS device
32—sensor matrix of unit cells
34—driver IC
36—AFE IC
40—sensor interface circuitry
42—unit cell interface circuitry
44—conversion element
50—display system
52—display panel
54—finger
M1—reset transistor
M2—amplification transistor
Vdd—voltage supply
PDB—photodiode biasing line
GND—reference voltage or ground
RST—reset control line
$V_{GATE}$—gate voltage at amplification transistor

What is claimed is:

1. A unit cell for use in an optical active pixel sensor (APS), the unit cell comprising:
   a photodiode having a first terminal connected to a photodiode biasing line that supplies a photodiode biasing signal PDB, and a second terminal opposite from the first terminal;
   a reset switch transistor having a first terminal connected to the second terminal of the photodiode, and a second terminal connected to a reference voltage line, and a gate of the reset switch transistor is connected to a reset signal supply line that supplies a reset signal RST;
   an amplification transistor having a first terminal connected to an output readout line, and a second terminal connected to a driving voltage supply line, and a gate of the amplification transistor is connected to a node constituting the connection of the second terminal of the photodiode and the first terminal of the reset switch transistor; and
   a driver IC configured to supply the photodiode biasing signal PDB and the reset signal RST;
   wherein:
   the driver IC sets the reset signal RST to a low level and sets the photodiode biasing signal PDB to a low level during a plurality of inter-cycle delay times,
   the driver IC sets the reset signal RST to a high level so as to turn on the reset switch transistor during a plurality of reset stages, and sets the photodiode biasing signal PDB to a high level so as to turn on the amplification transistor during a plurality of readout stages;
   the plurality of readout stages includes a first readout stage and a second readout stage provided between a first reset stage and a second reset stage of the plurality of reset stages, the first reset stage and the second reset stage being two adjacent reset stages of successive cycles;
   the first reset stage, a first inter-cycle delay time of the plurality of inter-cycle delay times, and the first readout stage are provided consecutively in order; and
   the second readout stage, a second inter-cycle delay time of the plurality of inter-cycle delay times, and the second reset stage are provided consecutively in order.

2. The unit cell of claim 1, wherein the reset switch transistor and the amplification transistor are thin film transistors.

3. The unit cell of claim 1, wherein the reset switch transistor and the amplification transistor are n-type indium gallium zinc oxide (IGZO) transistors.

4. The unit cell of claim 1, wherein the first terminal of the photodiode is an anode and the second terminal of the photodiode is a cathode.

5. An optical active pixel sensor (APS) comprising: a sensor matrix comprising a plurality of unit cells according to claim 1 arranged in an array of rows and columns.

6. The optical APS of claim 5, wherein the driver IC is connected to the sensor matrix and supplies the reset signal RST to reset switch transistors of the sensor matrix, and supplies the photodiode biasing signal PDB to photodiodes of the sensor matrix; and
further comprising an analogue front end (AFE) connected to the sensor matrix that reads and processes output readout signals that are outputted from output readout lines of the sensor matrix.

7. The optical APS of claim 6, wherein the driver IC is configured to provide the RST and PDB signals on a row basis of unit cells of the sensor matrix, and the AFE is configured to read the output readout signals on a column basis of unit cells of the sensor matrix.

8. The optical APS of claim 6, further comprising interface circuitry connected between the sensor matrix and the AFE, wherein the interface circuitry is configured to apply signal conditioning to adapt the output readout signals to a specification of the AFE.

9. The optical APS of claim 8, wherein the interface circuitry is implemented on a same substrate as the sensor matrix.

10. The optical APS of claim 6, further comprising reference voltage supply lines that supply a reference voltage to the sensor matrix, and driving voltage supply lines that supply a driving voltage to the sensor matrix to generate the output readout signals.

11. The optical APS of claim 10, wherein the reference voltage supply lines are arranged in a first direction, and the driving voltage supply lines are arranged in a second direction perpendicular to the first direction.

12. A display system comprising:
a display panel; and
an optical APS of claim 5 located adjacent to the display panel, wherein the optical APS senses light that is incident to the display system.

13. A method of operating an optical active pixel sensor (APS) comprising the steps of:
arranging a plurality of unit cell pixel circuits in a sensor matrix of rows and columns, wherein each unit cell of the plurality of unit cells is operable in a plurality of reset stages, a photo-sensing stage, and a plurality of readout stages;
wherein:
each of the plurality of reset stages comprises: applying a reset signal RST to turn on a reset transistor of the unit cell to electrically connect a first terminal of a photodiode of the unit cell to a reference voltage; applying a photodiode biasing signal PDB to a second terminal of the photodiode, wherein PDB is set relative to the reference voltage to reverse bias the photodiode and to charge a capacitance of the photodiode; and at the end of the reset stage, switching RST to turn off the reset transistor to electrically isolate the photodiode from the reference voltage;
the photo-sensing stage comprises: absorbing incident light with the photodiode, wherein the photodiode capacitance discharges proportionally to an illuminance of the incident light; and wherein discharging the photodiode capacitance pulls a gate voltage of an amplification transistor connected to the second terminal of the photodiode toward PDB in an amount proportional to the illuminance of the incident light;
each of the plurality of readout stages comprises pulsing PDB to a level to raise the gate voltage of the amplification transistor sufficiently to turn on the amplification transistor; and reading out an output readout signal from the amplification transistor, wherein the output readout signal is dependent upon the gate voltage of the amplification transistor; and the illuminance of the incident light is determinable based on the output readout signal;
a plurality of inter-cycle delay times is provided, in which the reset signal RST is set to a low level to turn off the reset switch transistor and the photodiode biasing signal PDB is set to a low level to reverse bias the photodiode;
the plurality of readout stages includes a first readout stage and a second readout stage provided between a first reset stage and a second reset stage of the plurality of reset stages, the first reset stage and the second reset stage being two adjacent reset stages of successive cycles;
the first reset stage, a first inter-cycle delay time of the plurality of inter-cycle delay times, and the first readout stage are provided consecutively in this order; and
the second readout stage, a second inter-cycle delay time of the plurality of inter-cycle delay times, and the second reset stage are provided consecutively in order.

14. The method of operating an optical APS of claim 13, wherein each unit cell of the plurality of unit cells further is operable to perform a reset noise cancellation operation to cancel reset noise that is introduced during a reset stage from among the plurality of reset stages, the reset noise cancellation operation comprising:
after the reset stage and before the photo-sensing stage, performing the first readout stage comprising performing the readout stage as recited in claim 13, and reading out an output readout signal from the amplification transistor and measuring a first photodiode output V1;
after the photo-sensing stage, performing the second readout stage comprising performing the readout stage as recited in claim 13 and measuring a second photodiode output V2; and
electronically subtracting (V2−V1) to generate an output readout signal that is not affected by the reset noise.

15. The method of operating an optical APS of claim 13, further comprising setting a level of PDB during the reset and photo-sensing stages, and a duration of the photo-sensing stage, in combination to avoid saturation of the photodiode during the photo-sensing stage.

16. The method of operating an optical APS of claim 13, wherein the plurality of readout stages do not affect the charge of the photodiode.

17. The method of operating an optical APS of claim 13, wherein RST and PDB are applied to the sensor matrix on a row basis, and the output readout signals are read on a column basis.

18. The method of operating an optical APS of claim 13, wherein the readout output signal is an output current, and the method further comprises converting the output current to an output voltage for determining the illuminance of the incident light.

19. The method of operating an optical APS of claim 13, wherein there is no overlap of time-adjacent PDB pulses of different rows.

* * * * *